United States Patent
Ikuma et al.

(10) Patent No.: US 9,177,881 B2
(45) Date of Patent: Nov. 3, 2015

(54) HIGH-FREQUENCY SEMICONDUCTOR PACKAGE AND HIGH-FREQUENCY SEMICONDUCTOR DEVICE

(71) Applicant: Kabushiki Kaisha Toshiba, Minato-ku (JP)

(72) Inventors: Yoshiyuki Ikuma, Kanagawa (JP); Masatoshi Suzuki, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 18 days.

(21) Appl. No.: 14/093,849

(22) Filed: Dec. 2, 2013

(65) Prior Publication Data

US 2014/0252569 A1  Sep. 11, 2014

(30) Foreign Application Priority Data

Mar. 7, 2013 (JP) .................. 2013-045637

(51) Int. Cl.
*H01L 23/10* (2006.01)
*H01L 23/552* (2006.01)
(Continued)

(52) U.S. Cl.
CPC .............. *H01L 23/10* (2013.01); *H01L 23/045* (2013.01); *H01L 23/552* (2013.01); *H01L 23/66* (2013.01); H01L 23/20 (2013.01); H01L 2224/04042 (2013.01); H01L 2224/06135 (2013.01); H01L 2224/32245 (2013.01); H01L 2224/45144 (2013.01); H01L 2224/48091 (2013.01); H01L 2224/48227 (2013.01); H01L 2224/49175 (2013.01); H01L 2224/73265 (2013.01);
(Continued)

(58) Field of Classification Search
CPC ..... H01L 23/045; H01L 23/66; H01L 23/552; H01L 23/10
USPC .......................................... 257/659
See application file for complete search history.

(56) References Cited

U.S. PATENT DOCUMENTS 5,847,453 A * 12/1998 Uematsu et al. .............. 257/728
6,756,660 B2   6/2004 Yasunaga et al.
(Continued)

FOREIGN PATENT DOCUMENTS

EP   1 777 775 A1   4/2007
JP   7-307420 A   11/1995
(Continued)

OTHER PUBLICATIONS

Extended European Search Report issued Sep. 9, 2014 in Patent Application No. 13195139.4.
(Continued)

*Primary Examiner* — Walter H Swanson
(74) *Attorney, Agent, or Firm* — Oblon, McClelland, Maier & Neustadt, L.L.P.

(57) ABSTRACT

Certain embodiments provide a high-frequency semiconductor package including: a base which is made of metal and is a grounding portion; a multi-layer wiring resin substrate; a first internal conductor film; and a lid. The multi-layer wiring resin substrate is provided on a top surface of the base, and has a frame shape in which a first cavity from which the top surface of the base is exposed is formed. The first internal conductor film covers surfaces which form a top surface of the multi-layer wiring resin substrate and an inner wall surface of the first cavity, and is electrically connected with the base. The lid is attached onto the multi-layer wiring resin substrate, and seals and covers the first cavity.

17 Claims, 4 Drawing Sheets

(51) Int. Cl.
*H01L 23/66* (2006.01)
*H01L 23/045* (2006.01)
*H01L 23/20* (2006.01)

(52) U.S. Cl.
CPC .................. *H01L2924/1515* (2013.01); *H01L 2924/15153* (2013.01); *H01L 2924/16152* (2013.01); *H01L 2924/16172* (2013.01); *H01L 2924/16176* (2013.01); *H01L 2924/16195* (2013.01); *H01L 2924/16251* (2013.01)

(56) References Cited

U.S. PATENT DOCUMENTS

2003/0042582 A1 3/2003 Crane, Jr. et al.
2003/0155634 A1 8/2003 Yasunaga et al.
2005/0012192 A1 1/2005 Saso

FOREIGN PATENT DOCUMENTS

| JP | 11-17349 A | 1/1999 |
| JP | 2002-368561 A | 12/2002 |
| JP | 3606837 | 10/2004 |
| JP | 2004-342949 A | 12/2004 |
| JP | 2008-42063 | 2/2008 |

OTHER PUBLICATIONS

Office Action issued Mar. 10, 2015 in Japanese Patent Application No. 2013-045637 (with partial English language translation).

* cited by examiner

HIGH-FREQUENCY SEMICONDUCTOR PACKAGE AND HIGH-FREQUENCY SEMICONDUCTOR DEVICE

CROSS REFERENCE TO RELATED APPLICATIONS

This application is based upon and claims the benefit of priority from the prior Japanese Patent Applications No. 2013-045637 filed in Japan on Mar. 7, 2013; the entire contents of which are incorporated herein by reference.

FIELD

Embodiments described herein relate generally to high-frequency semiconductor package and high-frequency semiconductor device.

BACKGROUND

A micro wave high-frequency semiconductor element which is formed with a compound semiconductor mainly made of, for example, GaAs or GaN and the like is usually accommodated in a high-frequency semiconductor package and is used. The high-frequency semiconductor package is requested to have an electromagnetic shield function which shields a high-frequency semiconductor element from an external high frequency and an airtight function which protects the high-frequency semiconductor element from, for example, moisture and the like. Further, the high-frequency semiconductor package of this type also is requested to have a heat radiation function of effectively radiating heat produced by the high-frequency semiconductor element.

Conventionally, for a general high-frequency semiconductor package, a package which adopts a structure obtained by combining metal and ceramic and a package made of ceramic are well known. Further, as introduced in, for example, JP 3606837 B1, a package obtained by resin-molding a semiconductor element is well known. Furthermore, as introduced in JP 2008-42063 A, a package which makes a device to increase heat radiation characteristics is invented.

However, a semiconductor package obtained by resin-molding a high-frequency semiconductor element as introduced in JP 3606837 B1 has many problems in terms of poor electromagnetic shield performance, or electric characteristics of resin or permeability with respect to, for example, moisture and the like, and therefore performance and reliability of the high-frequency semiconductor element are hardly guaranteed.

By contrast with this, a semiconductor package which adopts a structure obtained by combining metal and ceramic is made of ceramic, and therefore is expensive. Further, this semiconductor package is formed in many cases by way of secondary adhesion of a heat spreader which is made of a metal and is a radiator using, for example, silver solder, and therefore there is a problem with adhesion position precision of the heat spreader which is made of a metal and there is a problem that manufacturing cost becomes high due to this process.

Furthermore, to secure heat radiation characteristics in a semiconductor package made of ceramic or resin by letting heat out from a lower surface of a semiconductor element to an outside of the semiconductor package, it is necessary to provide through-holes or via holes highly densely in ceramic or resin. When desired heat radiation characteristics are not satisfied only by providing through-holes or via holes highly densely, it is necessary to make a device of, for example, adopting a structure in which a heat radiation electrode is attached to a top surface of a semiconductor element as introduced in JP 2008-42063 A to further improve the heat radiation characteristic. However, this device does not satisfy a sufficient heat radiation property. This semiconductor package made of ceramic or resin has a limited amount of heat generation of a semiconductor element which can be mounted.

BRIEF DESCRIPTION OF THE DRAWINGS

FIGS. 5A and 5B are views each enlarging a main part of the high-frequency semiconductor device mounted on a surface of a printed wiring board.

DETAILED DESCRIPTION

Certain embodiments provide a high-frequency semiconductor package including: a base which is made of metal and is a grounding portion; a multi-layer wiring resin substrate; a first internal conductor film; and a lid. The multi-layer wiring resin substrate is provided on a top surface of the base, and has a frame shape in which a first cavity from which the top surface of the base is exposed is formed. The first internal conductor film covers surfaces which form a top surface of the multi-layer wiring resin substrate and an inner wall surface of the first cavity. Further, the first internal conductor film is electrically connected with the base. The lid is attached onto the multi-layer wiring resin substrate, and seals and covers the first cavity.

Certain embodiments provide a high-frequency semiconductor device including: a base which is made of metal and is a grounding portion; a multi-layer wiring resin substrate; a first internal conductor film; a high-frequency semiconductor element; and a lid. The multi-layer wiring resin substrate is provided on a top surface of the base, and has a frame shape in which a first cavity from which the top surface of the base is exposed is formed. The first internal conductor film a top surface of the multi-layer wiring resin substrate and an inner wall surface of the first cavity, and is electrically connected with the base. The high-frequency semiconductor element is arranged in the first cavity, and is electrically connected with the multi-layer wiring resin substrate. The lid is attached onto the multi-layer wiring resin substrate, and seals and covers the first cavity.

Hereinafter, a high-frequency semiconductor package and a high-frequency semiconductor device according to an embodiment will be described in detail using the drawings.

Figure 1:
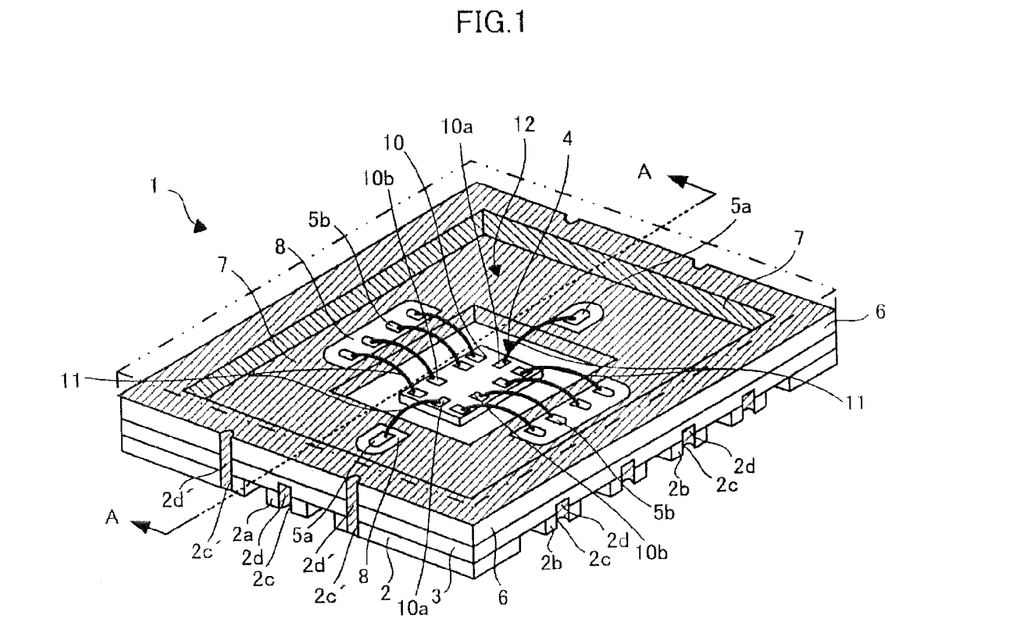
FIG. 1 is a perspective view illustrating a state in which a lid is removed from a schematic configuration of a high-frequency semiconductor device according to an embodiment.
Figure 2:
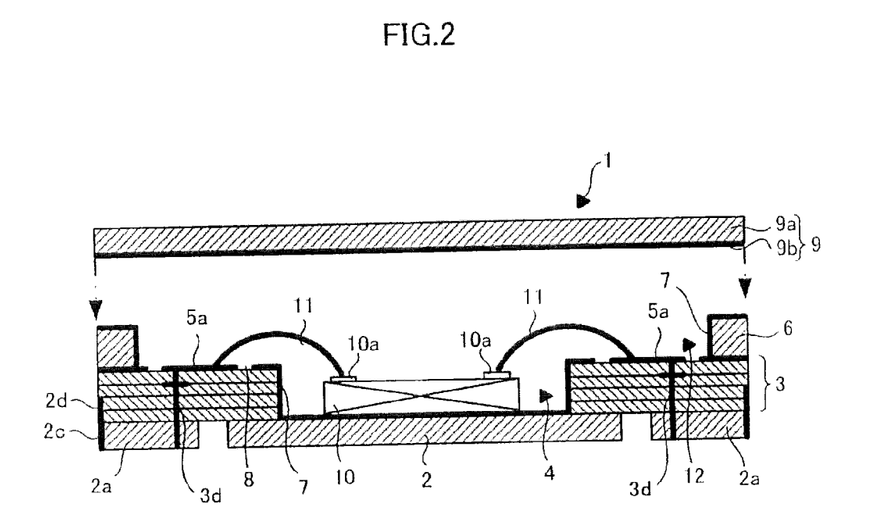
FIG. 2 is a view illustrating a cross-sectional structure of the high-frequency semiconductor device illustrated in FIG. 1.

FIG. 1 is a perspective view illustrating a schematic configuration of a high-frequency semiconductor device according to the embodiment. Meanwhile, in FIG. 1, a lid which forms a high-frequency semiconductor package 1 is not illustrated, and an inner structure of this high-frequency semiconductor package 1 is illustrated for ease of understanding. Further, FIG. 2 is a cross-sectional view along an A-A line of the high-frequency semiconductor device illustrated in FIG. 1. In addition, the A-A line is a line which goes along the top surface of a frame 6 in FIG. 1.

According to this high-frequency semiconductor device, the high-frequency semiconductor element 10 is mounted inside the high-frequency semiconductor package 1.

The high-frequency semiconductor package 1 includes a base 2 made of a metal and a frame-shaped multi-layer wiring resin substrate 3.

The base 2 is a metal of a substantially square flat shape, and is made of a thick copper foil having the thickness of about 100 μm. The base 2 functions as a grounding (GND) portion which defines a reference potential of the high-frequency semiconductor package 1, and also functions as a radiator of the high-frequency semiconductor element 10. The base 2 may not necessarily be a copper foil, and may be made of a metal such as a composite material of copper and molybdenum, a composite material of copper and tungsten, a metal laminated by copper and molybdenum, a metal laminated by copper and Inver alloy (CIC), aluminum, an aluminum silicon alloy or a composite material of aluminum and silicon carbide.

The multi-layer wiring resin substrate 3 is provided in a frame shape along an outer periphery portion of the top surface of the base 2, and has the thickness of, for example, about several hundred μm. In this multi-layer wiring resin substrate 3, a first cavity (space) 4 is formed at a center portion inside the multi-layer wiring resin substrate by exposing the surface of the base (thick copper foil) 2. The high-frequency semiconductor element 10 is accommodated inside the first cavity 4 and is electrically connected by bonding wires 11 made of, for example, gold wires (Au) and the like to form the high-frequency semiconductor device.

The first cavity 4 is formed by applying laser process or machine process to a center area of the multi-layer wiring resin substrate 3 and exposing the top surface of the base 2. Further, to secure a depth (height) of the first cavity 4 as a depth (height) which allows the high-frequency semiconductor element 10 to be packaged, for example, the number of layers of the multi-layer wiring resin substrate 3 only needs to be increased or decreased.

Figure 3:
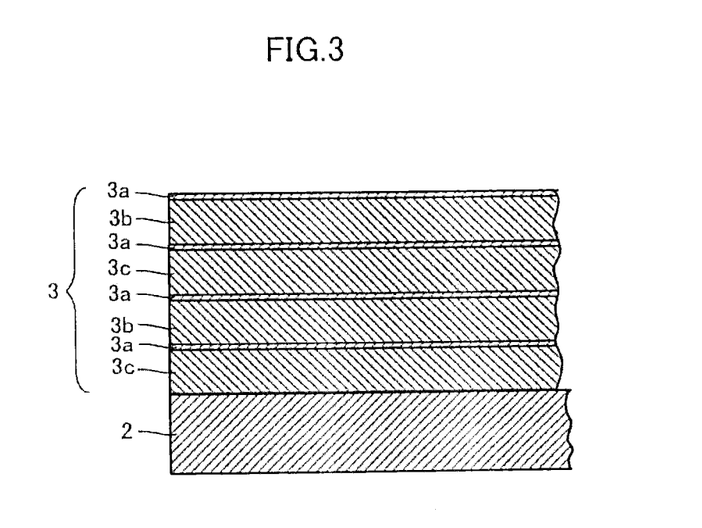
FIG. 3 is a view schematically illustrating a structure of a multi-layer wiring resin substrate.

FIG. 3 is a view schematically illustrating a structure of the multi-layer wiring resin substrate 3. As illustrated in FIG. 3, the multi-layer wiring resin substrate 3 is formed by stacking a plurality of cores 3b which is made of resin through a thermosetting resin (prepreg) 3c.

Conductor layers on which predetermined wiring patterns are formed and which are made of, for example, the thin copper foils 3a are formed on both surfaces of each core 3b made of resin. Further, the thin copper foils 3a are electrically connected where necessary by through-holes 3d (FIG. 2) provided in the multi-layer wiring resin substrate 3. Similarly, the thin copper foils 3a and the base (thick copper foil) 2 are both electrically connected where necessary by the through-holes 3d (FIG. 2) provided in the multi-layer wiring resin substrate 3.

The through-holes 3d are formed at pitches which are sufficiently shorter than a wavelength of a frequency used by the high-frequency semiconductor element 10. These through-holes 3d are formed by being buried by, for example, resin and applying copper cover plating to through-hole end portions exposed in the top surface of the multi-layer wiring resin substrate 3 and the back surface of the base 2. By this, the top surface of the multi-layer wiring resin substrate 3 becomes flat and substantially all inner lateral surfaces of a depressed portion of a two-stage structure of the high-frequency semiconductor package 1 can be easily covered by the conductor film 7 made of a metal.

As illustrated in FIG. 1, on the top surface of the multi-layer wiring resin substrate 3, a plurality of high-frequency signal internal electrodes 5a and a plurality of power/control signal internal electrodes 5b which connect this substrate 3 and electrode terminals (not illustrated) of the high-frequency semiconductor element 10 are formed. The internal electrodes 5a and 5b are arranged to surround the first cavity 4 in the top surface of the multi-layer wiring resin substrate 3.

The high-frequency signal internal electrode 5a is connected to a high-frequency signal external connection terminal 2a which is formed at a rim portion of the base (thick copper foil) 2 to be insulated from the base 2, through the multi-layer wiring resin substrate 3. Further, the power/control signal internal electrode 5b is connected to a power/control signal external connection terminal 2b which is formed at a rim portion of the base (thick copper foil) 2 to be insulated from the base 2, through the multi-layer wiring resin substrate 3. These internal electrodes 5a and 5b are applied surface processing (plating) which is suitable for bonding. Further, the internal electrodes 5a and 5b and the signal terminals 10a and 10b of the high-frequency semiconductor element 10 are electrically connected by the bonding wires 11 made of, for example, gold wires (Au) and the like. In addition, the above high-frequency signal external connection terminal 2a is the terminal 2a which receives an input and an output of a high-frequency signal supplied to the high-frequency semiconductor element 10, and the above power/control signal external connection terminal 2b is a terminal which receives an input of power or a control signal supplied to the high-frequency semiconductor element 10.

Further, the frame 6 made of resin is provided on the top surface of the multi-layer wiring resin substrate 3 and along the periphery of this multi-layer wiring resin substrate 3 to surround all internal electrodes 5a and 5b. At a center portion inside the frame 6, a second cavity (space) 12 is formed. The second cavity 12 and the first cavity 4 integrally play a role of protecting wires (for example, the bonding wires 11) which connect the high-frequency internal electrodes 5a and the power/control signal internal electrodes 5b, and the high-frequency semiconductor elements 10. Further, the second cavity 12 plays a role of forming predetermined space between the high-frequency semiconductor element 10 and the lid 9 when the lid (FIG. 2) is formed on the frame 6. Hence, to electrically connect the accommodated high-frequency semiconductor element 10 to the high-frequency semiconductor package 1, the depressed portion of the two-stage structure (one depressed portion is the first cavity 4 which is surrounded by the multi-layer wiring resin substrate 3 and the other depressed portion is the second cavity 12 which is surrounded by the frame 6) is formed inside the high-frequency semiconductor package 1.

Except the high-frequency signal internal electrodes 5a and the power/control signal internal electrodes 5b, the top surface of the frame 6 and the inner wall surface which surrounds the second cavity 12, and the top surface of the multi-layer wiring resin substrate 3 and the inner wall surface which surrounds the first cavity 4 are covered by a first internal conductor film 7 as much as possible. This first internal conductor film 7 is made of, for example, copper (Cu) having the thickness of 10 to 50 μm. Meanwhile, the phrase "as much as possible" means forming, around the internal electrodes 5a and 5b, insulation areas (substrate resin exposure areas) 8 of micro widths which separate the high-frequency signal internal electrodes 5a and the power/control signal internal electrodes 5b from the first internal conductor films 7 and make these internal electrodes 5a and 5b independent like islands from the internal conductor films 7. Hence, the first internal conductor film 7 is provided on a substantially all inner lateral surfaces of the depressed portion of the two-stage structure of the high-frequency semiconductor package 1 except the internal electrodes 5a and 5b and the micro insulation areas (substrate resin exposure areas) 8.

As illustrated in FIG. 2, the lid 9 is attached to an upper end surface of the frame 6. The lid 9 covers the top surface of the high-frequency semiconductor package 1 to seal the depressed portion of the two-stage structure. The high-frequency semiconductor package 1 is preferably sealed by the lid 9 by trapping inert gas such as nitrogen (N) in internal space including the first cavity 4 in which the high-frequency semiconductor element 10 is accommodated. In addition, the lid 9 includes a resin plate 9a whose outer periphery or an inner surface is provided with a second internal conductor film 9b. When the lid 9 is attached to the upper end surface of the frame 6, the second internal conductor film 9b of the lid 9 conducts with the first internal conductor film 7 of the upper end surface of the frame 6. In addition, the lid 9 may be a metal plate, and, when this lid 9 is attached to the upper end surface of the frame 6, the lid 9 itself conducts with the first internal conductor film 7 of the upper end surface of the frame 6.

Figure 4:
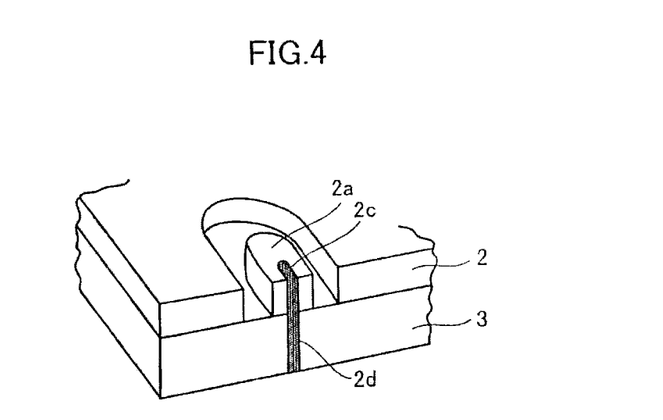
FIG. 4 is a view of a structure of a connection terminal provided to a base illustrating a state where a high-frequency semiconductor package is seen from a back surface side.

FIG. 4 is a view of a structure of a connection terminal provided to the base 2 illustrating a state where the high-frequency semiconductor package is seen from a back surface side. Hereinafter, the high-frequency signal external connection terminals 2a formed at the rim portions of the base (thick copper foil) 2 will be described with reference to FIG. 4. This connection terminal 2a is provided along the rim portion of the base (thick copper foil) 2. More specifically, for example, the connection terminal 2a is separated from the base 2 by, for example, etching and removing part of a flat metal body which becomes the base 2 to a U shape, and the like, and is formed as an island-shaped conductor portion exposed to a lateral portion of the high-frequency semiconductor package 1.

In the high-frequency signal external connection terminal 2a exposed and provided at the lateral portion (end portion) of the high-frequency semiconductor package 1, a first groove 2c is provided from a lateral portion end surface of the high-frequency signal external connection terminal to a lateral portion end surface of the multi-layer wiring resin substrate 3. Further, in this first groove 2c, the first lateral surface conductor film 2d is provided. As illustrated in FIG. 1, these first groove 2c and first lateral surface conductor films 2d are provided likewise to all external connection terminals 2a and 2b. The first groove 2c is not provided in the frame 6, and the first lateral surface conductor film 2d in the first groove 2c is insulated from the first internal conductor film 7.

Further, at the lateral portion of the high-frequency semiconductor package 1, a plurality of second grooves 2c' in which second lateral surface conductor films 2d' are provided is provided from a lateral portion end surface of the base 2 to a lateral portion end surface of the frame 6. The second grooves 2c' are provided from the lateral surface of the base 2 to the lateral surface of the frame 6, and the second lateral surface conductor films 2d' in the second grooves 2c' are electrically connected with the first internal conductor film 7.

Hence, the base 2 and the first internal conductor film 7 are electrically connected by the second lateral surface conductor films 2d' in the second grooves 2c'.

FIGS. 5A and 5B are views each enlarging a main part of the high-frequency semiconductor device mounted on a surface of a printed wiring board. FIG. 5A is a view enlarging the main part of the high-frequency semiconductor device which has the high-frequency semiconductor package provided with the first and second grooves 2c and 2', and FIG. 5B is a view enlarging the main part of the high-frequency semiconductor device which has the high-frequency semiconductor package without the first and second grooves.

As illustrated in FIG. 5A, for example, the high-frequency signal external connection terminal 2a is connected to wire 15 which is a conductor portion of the printed wiring board 14 through a solder 13 to mount the high-frequency semiconductor device on the surface of the printed wiring board 14. In this case, the solder 13 can be formed in contact with the high-frequency signal external connection terminal 2a and in contact with the first lateral surface conductor film 2d in the first groove 2c. By increasing an area in which the high-frequency semiconductor device and the solder 13 contact, it is also possible to increase a contact area between the solder 13 and the wire 15 of the printed wiring board 14. Consequently, the high-frequency signal external connection terminal 2a and the wire 15 of the printed wiring board 14 are coupled mechanically strongly. In addition, although not illustrated, similarly, by providing the second grooves 2c' in the high-frequency semiconductor device and providing the second lateral surface conductor films 2d' in the grooves 2c', it is possible to couple the base 2 and the wires of the printed wiring board 14 through the solders 13 mechanically strongly. That is, by providing the first and second grooves 2c and 2c' in the high-frequency semiconductor device and forming the first and second lateral surface conductor films 2d and 2d' in these grooves 2c and 2c', it is possible to highly reliably mount the high-frequency semiconductor device on the printed wiring board 14.

By contrast with this, as illustrated in FIG. 5B, when the high-frequency semiconductor device in which grooves are not formed is mounted on the surface of the printed wiring board 14, high-frequency signal external connection terminal 102a of the high-frequency semiconductor device is connected to the wire 15 of the printed wiring board 14 through a solder 103. In this case, a contact area between the solder 103 and the high-frequency signal external connection terminal 102a is smaller than that in FIG. 5A. Hence, a contact area between the solder 103 and the wire 15 of the printed wiring board 14 is also smaller than that in FIG. 5A. Therefore, reliability to mount the high-frequency semiconductor device in which the grooves are not formed, on the printed wiring board 14 is lower than reliability to mount the high-frequency semiconductor device which has the grooves 2c and 2c'.

As described above, the first and second lateral surface conductor films 2d and 2d' in the first and second grooves 2c and 2' play a role of coupling the high-frequency semiconductor device mechanically strongly to the printed wiring board 14 and improving reliability of mounting.

Figure 5:
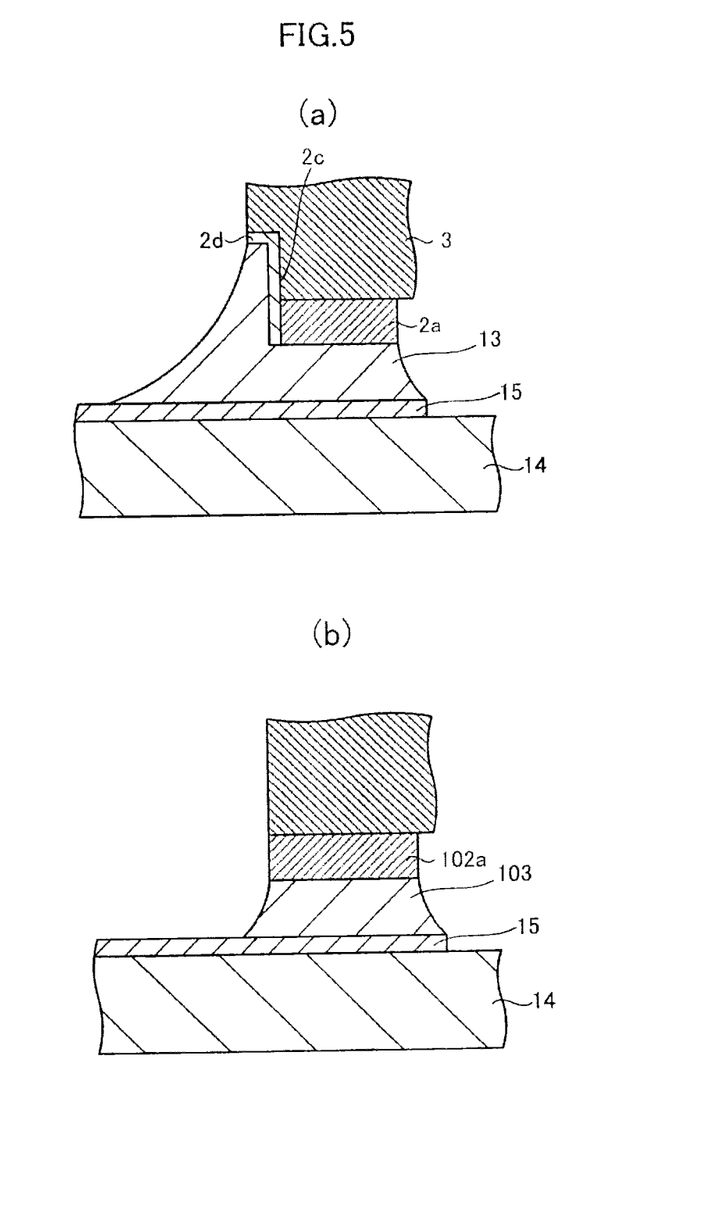
FIG. 5A is a view schematically illustrating the embodiment and FIG. 5B is a view schematically illustrating an example which does not use the embodiment.

The high-frequency semiconductor package 1 and the high-frequency semiconductor device according to the above-described embodiment are mounted on the surface of the printed wiring board 14 as described above and grounded by placing the base 2 in contact with ground wires of the printed wiring board 14 (FIG. 5). Meanwhile, the base 2 is electrically connected with the first internal conductor film 7 in the package 1 through the second lateral surface conductor films 2d' in the second grooves 2c'. Further, the first internal conductor film 7 is electrically to the second internal conductor film 9b of the lid 9. Hence, the base 2 is grounded and then internal space of the package 1 is surrounded by a ground potential and is shielded from a high frequency. As a result, it is possible to prevent a micro wave from leaking from the high-frequency semiconductor element 10 or prevent, for example, external noise from influencing the high-frequency semiconductor element 10.

Further, the high-frequency semiconductor package 1 and the high-frequency semiconductor device according to the embodiment are mounted on the surface of the printed wiring board as described above and thermally coupled to the printed wiring board 14 by placing the base 2 in contact with ground wires of the printed wiring board 14 (FIG. 5). As a result, heat radiation of the high-frequency semiconductor element 10 mounted in the first cavity 4 is performed through the base 2 of a high thermal conductivity, so that it is possible to sufficiently secure heat radiation characteristics of the high-frequency semiconductor package 1.

Further, the internal space of the package 1 (the first and second cavities 4 and 12) is surrounded by the first and second internal conductor films 7 and 9b, so that the high-frequency semiconductor package 1 and the high-frequency semiconductor device according to the embodiment can sufficiently secure airtightness and water-tightness for protecting the high-frequency semiconductor element 10 from, for example, moisture and the like, and sufficiently exhibit performance of the high-frequency semiconductor element 10 and sufficiently guarantee longevity and reliability. Furthermore, the internal space of the package 1 (the first and second cavities 4 and 12) is surrounded by the first and second internal films 7 and 9b, so that it is possible to prevent, for example, gas and the like produced from the multi-layer wiring resin substrate 3 and the frame 6 from entering the internal space of the package 1 (the first and second cavities 4 and 12), and effectively protect the high-frequency semiconductor element 10 from, for example, gas and the like produced by resin.

In addition to these advantages, the high-frequency semiconductor package 1 and the high-frequency semiconductor device according to the embodiment can realize the high-frequency semiconductor package 1 using a resin material which is mainly the multi-layer wiring resin substrate 3 instead of using expensive ceramic which is conventionally used for a package material. As a result, it is also possible to provide a practical advantage of providing the high-frequency semiconductor package 1 and the high-frequency semiconductor device at low cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, although, in FIGS. 1 and 2, the frame 6 which is provided along the periphery of the multi-layer wiring resin substrate 3 is formed using resin as a material, the frame may be formed using a metal such as copper instead of resin. That is, a configuration may be employed where the multi-layer wiring resin substrate 3 is provided on the base 2 made of copper and the frame 6 made of copper is provided along the periphery of the multi-layer wiring resin substrate.

Figure 6:
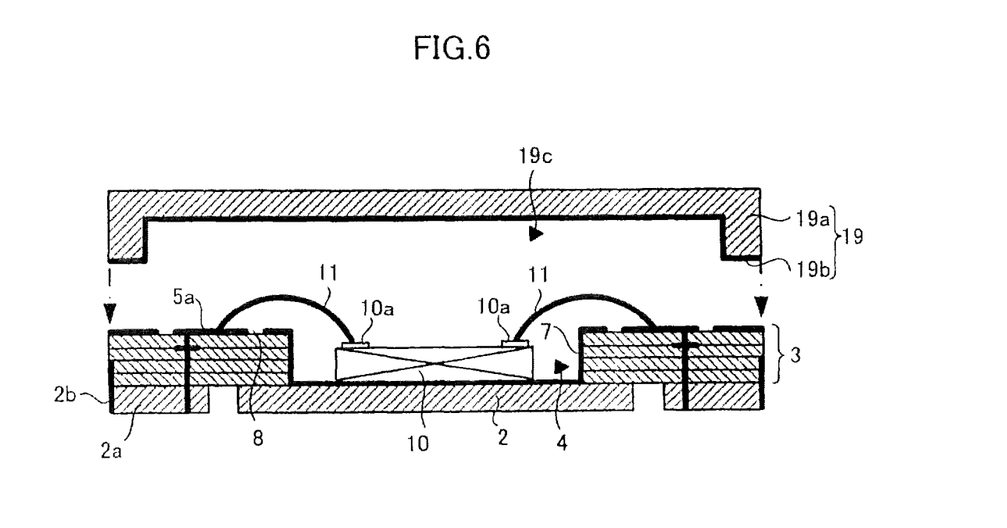
FIG. 6 is a cross-sectional view illustrating a schematic configuration of a high-frequency semiconductor device according to another embodiment.

Similarly, instead of the lid 9 of a flat shape illustrated in FIGS. 1 and 2, a lid 19 in which a second internal conductor film 19b is formed on an inner surface of a resin plate 19a in which a depressed portion 19c as illustrated in FIG. 6 is formed, or a lid 19 which is made of metal and in which a depressed portion is formed can also be used. In this case, a high-frequency semiconductor package of a so-called interposer structure from which the frame 6 is removed only needs to be realized. A second cavity of this high-frequency semiconductor package is formed by the depressed portion 19c. Further, in this case, the lid 19 may adopt an integrated structure or a structure obtained by combining a ring-shaped lid and a flat-shaped lid.

Furthermore, although an example of the high-frequency semiconductor package 1 and the high-frequency semiconductor device of a type which are mounted on a surface of a printed wiring board has been described with description of the above embodiment, the high-frequency semiconductor package 1 and the high-frequency semiconductor device are also applicable to a so-called drop-in type which connects the high-frequency semiconductor package 1 and wires of a printed wiring board using, for example, bonding wires, gold foils or copper foils and the like.

What is claimed is:

1. A high-frequency semiconductor package comprising:
a base which is made of metal and is a grounding portion;
a frame-shaped multi-layer wiring resin substrate which is provided on a top surface of the base and in which a first cavity from which the top surface of the base is exposed is formed, wherein the frame-shaped multi-layer wiring resin substrate includes an internal electrode which is formed on a top surface of the multi-layer wiring resin substrate, an external connection terminal which is formed on a bottom surface of the multi-layer wiring resin substrate so as to be insulated from the base, and a through-hole which electrically connects the internal electrode and the external connection terminal;
a first internal conductor film which covers the top surface of the multi-layer wiring resin substrate and an inner wall surface of the first cavity, and is electrically connected with the base;
a lid which is attached onto the multi-layer wiring resin substrate and seals and covers the first cavity;
a first groove which is provided from a lateral surface of the external connection terminal to a lateral surface of the multi-layer wiring resin substrate; and
a first lateral surface conductor film which is provided in the first groove,
wherein the first lateral surface conductor film is provided to be insulated from the first internal conductor film.

2. The high-frequency semiconductor package according to claim 1, wherein
the multi-layer wiring resin substrate is obtained by stacking a plurality of conductor layers through a plurality of resin layers.

3. The high-frequency semiconductor package according to claim 1, wherein
the lid is a resin member whose inner lateral surface is covered by a second internal conductor film, and
the lid is attached onto the multi-layer wiring resin substrate such that the second internal conductor film contacts the first internal conductor film.

4. The high-frequency semiconductor package according to claim 3, wherein
inert gas is trapped in the first cavity.

5. The high-frequency semiconductor package according to claim 1, further comprising a frame which is provided on the top surface of the multi-layer wiring resin substrate and in which a second cavity from which the first cavity is exposed is formed, wherein the first internal conductor film further covers surfaces which form a top surface of the frame and an inner wall surface of the second cavity, and the lid is attached onto the multi-layer wiring resin substrate through the frame, and seals and covers the first cavity and the second cavity.

6. The high-frequency semiconductor package according to claim 5, further comprising:

a second groove which is provided from a lateral surface of the base to a lateral surface of the frame; and a second lateral surface conductor film which is provided in the second groove, wherein the second lateral surface conductor film is provided to electrically connect the base and the first internal conductor film.

7. The high-frequency semiconductor package according to claim 6, wherein the lid is a resin member whose inner lateral surface is covered by a second internal conductor film, and the lid is attached onto the multi-layer wiring resin substrate through the frame such that the second internal conductor film contacts the first internal conductor film.

8. The high-frequency semiconductor package according to claim 7, wherein inert gas is trapped in the first cavity and the second cavity.

9. A high-frequency semiconductor device comprising:

a base which is made of metal and is a grounding portion;

a frame-shaped multi-layer wiring resin substrate which is provided on a top surface of the base and in which a first cavity from which the top surface of the base is exposed is formed, wherein the frame-shaped multi-layer wiring resin substrate includes an internal electrode which is formed on a top surface of the multi-layer wiring resin substrate, an external connection terminal which is formed on a bottom surface of the multi-layer wiring resin substrate so as to be insulated from the base, and a through-hole which electrically connects the internal electrode and the external connection terminal;

a first internal conductor film which covers the top surface of the multi-layer wiring resin substrate and an inner wall surface of the first cavity, and is electrically connected with the base;

a high-frequency semiconductor element which is arranged in the first cavity and is electrically connected with the multi-layer wiring resin substrate;

a lid which is attached onto the multi-layer wiring resin substrate and seals and covers the first cavity;

a first groove which is provided from a lateral surface of the external connection terminal to a lateral surface of the multi-layer wiring resin substrate; and a first lateral surface conductor film which is provided in the first groove, wherein the first lateral surface conductor film is provided to be insulated from the first internal conductor film.

10. The high-frequency semiconductor device according to claim 9, wherein the high-frequency semiconductor element is formed with a compound semiconductor, and the multi-layer wiring resin substrate is obtained by stacking a plurality of conductor layers through a plurality of resin layers.

11. The high-frequency semiconductor device according to claim 9, wherein a lower surface of the high-frequency semiconductor element is connected to the base, and a signal terminal of the high-frequency semiconductor element is electrically connected with the internal electrode.

12. The high-frequency semiconductor device according to claim 11, wherein the lid is a resin member whose inner lateral surface is covered by a second internal conductor film, and the lid is attached onto the multi-layer wiring resin substrate such that the second internal conductor film contacts the first internal conductor film.

13. The high-frequency semiconductor device according to claim 12, wherein inert gas is trapped in the first cavity.

14. The high-frequency semiconductor device according to claim 9, further comprising a frame which is made of resin and is provided on the top surface of the multi-layer wiring resin substrate and in which a second cavity from which the first cavity is exposed is formed, wherein the first internal conductor film further covers surfaces which form a top surface of the frame and an inner wall surface of the second cavity, and the lid is attached onto the multi-layer wiring resin substrate through the frame, and seals and covers the first cavity and the second cavity.

15. The high-frequency semiconductor device according to claim 14, further comprising:

a second groove which is provided from a lateral surface of the base to a lateral surface of the frame; and a second lateral surface conductor film which is provided in the second groove, wherein the second lateral surface conductor film is provided to electrically connect the base and the first internal conductor film.

16. The high-frequency semiconductor device according to claim 15, wherein the lid is a resin member whose inner lateral surface is covered by a second internal conductor film, and the lid is attached onto the multi-layer wiring resin substrate through the frame such that the second internal conductor film contacts the first internal conductor film.

17. The high-frequency semiconductor device according to claim 16, wherein inert gas is trapped in the first cavity and the second cavity.

* * * * *